United States Patent
Yang et al.

(10) Patent No.: US 6,701,478 B1
(45) Date of Patent: Mar. 2, 2004

(54) SYSTEM AND METHOD TO GENERATE A CRC (CYCLIC REDUNDANCY CHECK) VALUE USING A PLURALITY OF CRC GENERATORS OPERATING IN PARALLEL (75) Inventors: Changyong Yang, San Jose, CA (US); Paul B. Moore, Woodside, CA (US)

(73) Assignee: Nortel Networks Limited, St. Laurent (CA)

( * ) Notice: Subject to any disclaimer, the term of this patent is extended or adjusted under 35 U.S.C. 154(b) by 450 days.

(21) Appl. No.: 09/746,999

(22) Filed: Dec. 22, 2000

(51) Int. Cl.[7] .............................................. H03M 13/05
(52) U.S. Cl. ....................... 714/757; 714/758; 714/776; 714/781
(58) Field of Search ................................ 714/757–758, 714/776, 781–785

(56) References Cited

U.S. PATENT DOCUMENTS

| | | | | |
|---|---|---|---|---|
| 5,818,855 A | * | 10/1998 | Foxcroft | 714/759 |
| 5,862,171 A | * | 1/1999 | Mahany | 375/132 |
| 6,182,261 B1 | * | 1/2001 | Haller et al. | 714/758 |
| 6,192,498 B1 | * | 2/2001 | Arato | 714/781 |
| 6,530,057 B1 | * | 3/2003 | Kimmitt | 714/758 |
| 6,560,742 B1 | * | 5/2003 | Dubey et al. | 714/757 |
| 2002/0104058 A1 | * | 8/2002 | Rappaport | 714/784 |

FOREIGN PATENT DOCUMENTS

EP          470451 A2  *  2/1992  ..........  H03M/13/00

* cited by examiner

*Primary Examiner*—R. Stephen Dildine
(74) *Attorney, Agent, or Firm*—Blakely Sokoloff Taylor & Zafman LLP

(57) ABSTRACT

The present invention relates to a system and method to generate a CRC (Cyclic Redundancy Check) value using a plurality of CRC generators operating in parallel. The system includes a switching module operatively coupled to a parallel data bus. The switching module generates and places a packet cycle on the parallel data bus to transmit a data packet and packet modification commands to modify the data packet. The system further includes a bridging module operatively coupled to the parallel data bus. The bridging module modifies the data packet in accordance to the packet modification commands, and generates a Cyclic Redundancy Check (CRC) value to reflect modifications made to the data packet. The bridging module utilizes a plurality of CRC generators operating in parallel to generate the CRC value quickly and efficiently.

24 Claims, 5 Drawing Sheets

SYSTEM AND METHOD TO GENERATE A CRC (CYCLIC REDUNDANCY CHECK) VALUE USING A PLURALITY OF CRC GENERATORS OPERATING IN PARALLEL

BACKGROUND (1) Field

This invention relates to a system and method to generate a CRC (Cyclic Redundancy Check) value using a plurality of CRC generators operating in parallel.

(2) General Background

The detection and correction of errors during the transmission of data is crucial to ensuring the reliability and integrity of data. A number of techniques of detecting the corruption of data during transmission are widely employed. At one end of the scale, a simple parity-checking method may be employed. Where more sophisticated detection and correction capabilities are required, checksum or Cyclic Redundancy Check methods are used.

A Cyclic Redundancy Check (CRC) is a technique for preserving the integrity of a frame (or packet) that is being propagated from a data source to a data destination. Broadly, the CRC methodology requires that a CRC value be generated for a packet, and appended to the packet prior to propagation from the data source. The CRC is propagated, together with the associated packet, from the data source to the data destination, and the CRC can then be utilized at the data destination to detect any corruption of the packet that may have occurred during transmission of the packet.

The CRC is generated so that the resulting packet is exactly divisible by the predetermined CRC polynomial. Accordingly, the CRC creation process at the data source involves receiving the original packet and shifting it a certain number of bits to the left. The shifted original packet is then divided by the predetermined CRC polynomial. The remainder of this division process is then examined and, if it is not zero, the resulting packet has probably experience corruption during transmission. The Cyclic Redundancy Check (CRC) technique is advantageous in that it provides good error detection capabilities, and requires relatively little overhead.

SUMMARY OF THE INVENTION

The present invention relates to a system and method to generate a CRC (Cyclic Redundancy Check) value using a plurality of CRC generators operating in parallel.

The system includes a switching module operatively coupled to a parallel data bus. The switching module generates and places a packet cycle on the parallel data bus to transmit a data packet and packet modification commands to modify the data packet.

The system further includes a bridging module operatively coupled to the parallel data bus. The bridging module modifies the data packet in accordance to the packet modification commands, and generates a Cyclic Redundancy Check (CRC) value to reflect modifications made to the data packet. The bridging module utilizes a plurality of CRC generators operating in parallel to generate the CRC value quickly and efficiently. As a result, the bridging module is able to keep up the speed of the parallel data bus.

Other aspects and features of the present invention will be come apparent to those ordinarily skilled in the art upon review of the following description of specific embodiments of the invention in conjunction with the accompanying claims and figures.

DETAILED DESCRIPTION

The present invention relates to a system and method to generate a CRC (Cyclic Redundancy Check) value using a plurality of CRC generators operating in parallel.

Figure 1:
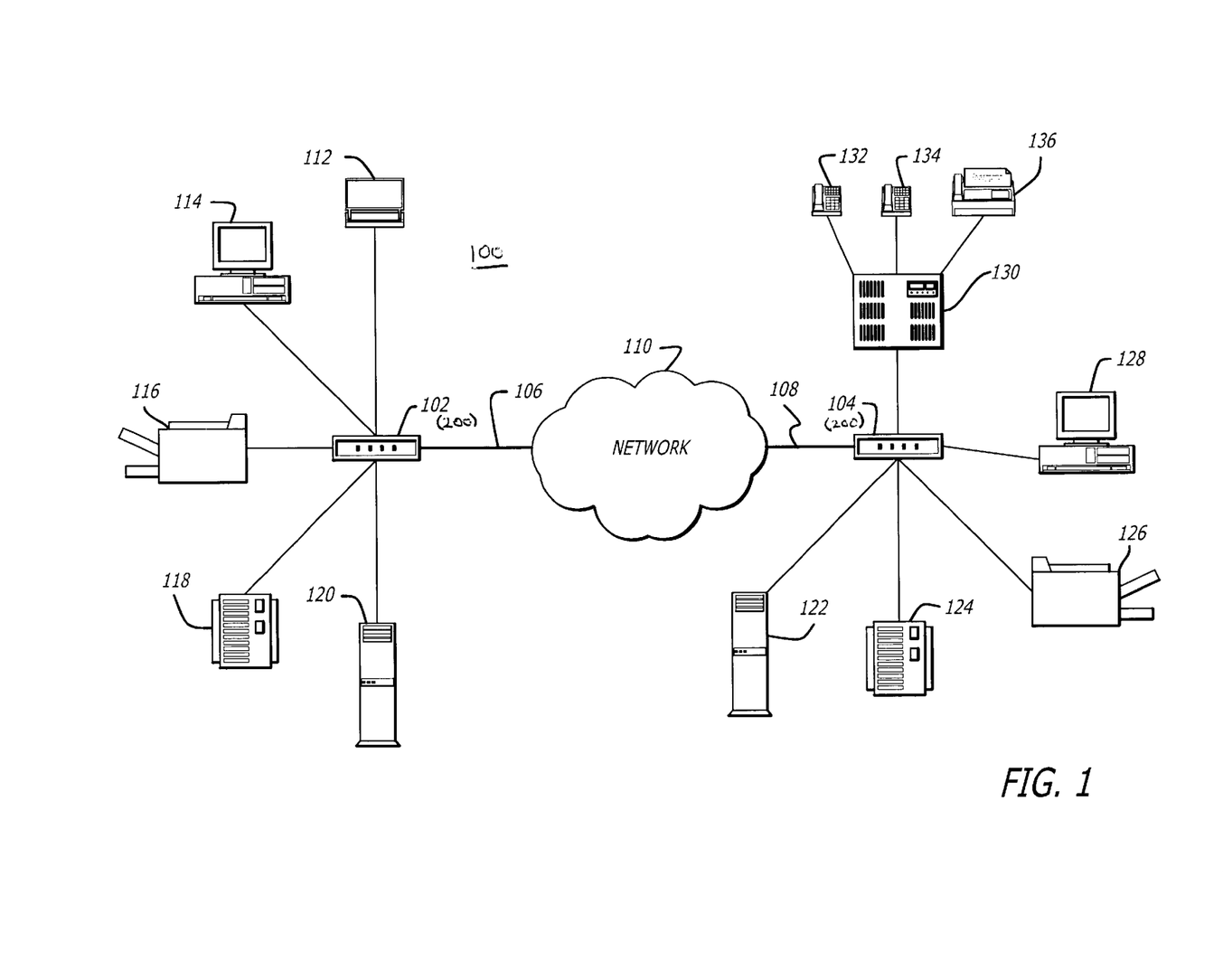
FIG. 1 is an exemplary diagram of a system in accordance with one embodiment of the present invention.

FIG. 1 is an exemplary diagram of a system 100 in accordance with one embodiment of the present invention. The system 100 includes network switches or routers 102, 104 that are operatively coupled together by network links 106,108 and network 110.

Network switch or router 102 is coupled to a plurality of network devices 112, 114, 116, 118, 120. Network devices are generally computing devices having networking capability. As illustrated in FIG. 1, examples of network devices can include a laptop computer 112, a desktop computer 114, a network printer 116, a network storage device 118, and a server 120. In practice, a network device can be a set-top-box, a hand-held device, or any computing devices with networking capability.

Network switch or router 104 is coupled to a plurality of network devices, including a server 122, a network storage device 124, a network printer 126, and a desktop 128. Network switch or router is also coupled to a private branch exchange (PBX) system 130. PBX system 130 is coupled to telephones 132, 134 and fax machine 136.

Figure 2:
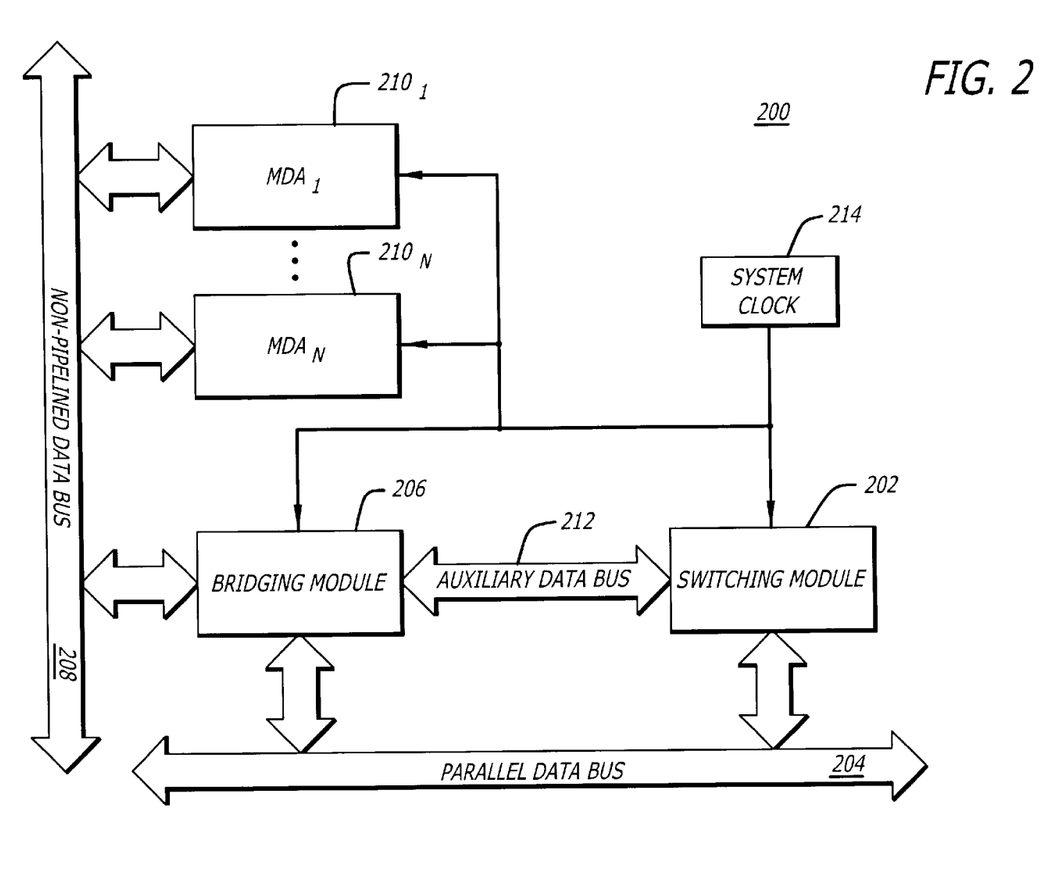
FIG. 2 is an exemplary block diagram of a network switch or router in accordance with one embodiment of the present invention.

FIG. 2 is an exemplary block diagram of a network switch or router 200 (also shown in FIG. 1) in accordance with one embodiment of the present invention. Network switch or router 200 includes switching module 202. In one embodiment, switching module 202 is a chipset that generally provides information required to switch or forward data packets to appropriate destinations.

To switch or forward data packets, switching module 200 generally puts the packets on parallel data bus 204. In one embodiment, parallel data bus 204 is a 64-bit bus clocked at 40 MHz, providing a maximum data bandwidth of 2.56 Gbps. A more detail description of the operational cycles of parallel data bus 204 will be provided below in FIG. 3 and the text describing the figure.

Network switch or router 200 also includes bridging module 206. In one embodiment, bridging module 206 is a chipset that generally retrieves data packets available on parallel data bus 204, processes these packets, and places the packets on non-parallel data bus 208 for media dependent adapters $210_1, \ldots 210_N$ ($MDA_1$ to $MDA_N$ where "N" is a positive integer) to process.

Furthermore, switching module 202 can also generate optional control data cycles on parallel data bus 204 to instruct bridging module 206 to modify the packets. A more detail description of the optional control data cycles will be provided below in FIG. 3 and the text describing the figure.

When and if bridging module 206 modifies content of a data packet, the module 206 needs to compute a new CRC value to reflect the changes made in the packet. Accordingly bridging module 206 includes functional components that are capable of computing CRC values. A more detail description of the components included in bridging module 206 to calculate CRC values will be provided below in FIG. 4 and the text describing the figure.

Media dependent adapters $210_1, \ldots, 210_N$ generally provide communication ports to establish linkage to different types of physical media external to network switch or router, including Asynchronous Transfer Mode (ATM), Ethernet (10/100 Mbps), Gigabit Ethernet, Shortwave Gigabit Fiber, Longwave Gigabit Fiber, and the like.

Each MDA $210_1, \ldots, 210_N$ monitors non-pipelined data bus 208 for packets addressed to the MDA $210_1, \ldots, 210_N$. If an MDA $210_1, \ldots, 210_N$ finds packets addressed to it, the MDA $210_1, \ldots, 210_N$ retrieves the packets from non-pipelined data bus 208 and processes them.

Switching module 202 also sends data over auxiliary data bus 212 to bridging module 206. The data that switching module 202 sends over auxiliary data bus 212 is generally control data to instruct bridging module 206 as how bridging module 206 should process data on parallel data bus 204.

Switching module 202 sends control data over auxiliary data bus 212 to bridging module 206 to generally prompt bridging module 206 to process packet data, resulting in faster processing of packet data.

Network switch or router 200 further includes a system clock 214 that is operatively connected to switching module 202, bridging module 206, and media dependent adapters $210_1, \ldots, 210_N$. System clock 214 generally provides time cycles periods with equal duration when modules 202, 206, $210_1, \ldots, 210_N$ in network switch or router 200 can access the data buses 204, 208, 212.

Figure 3:
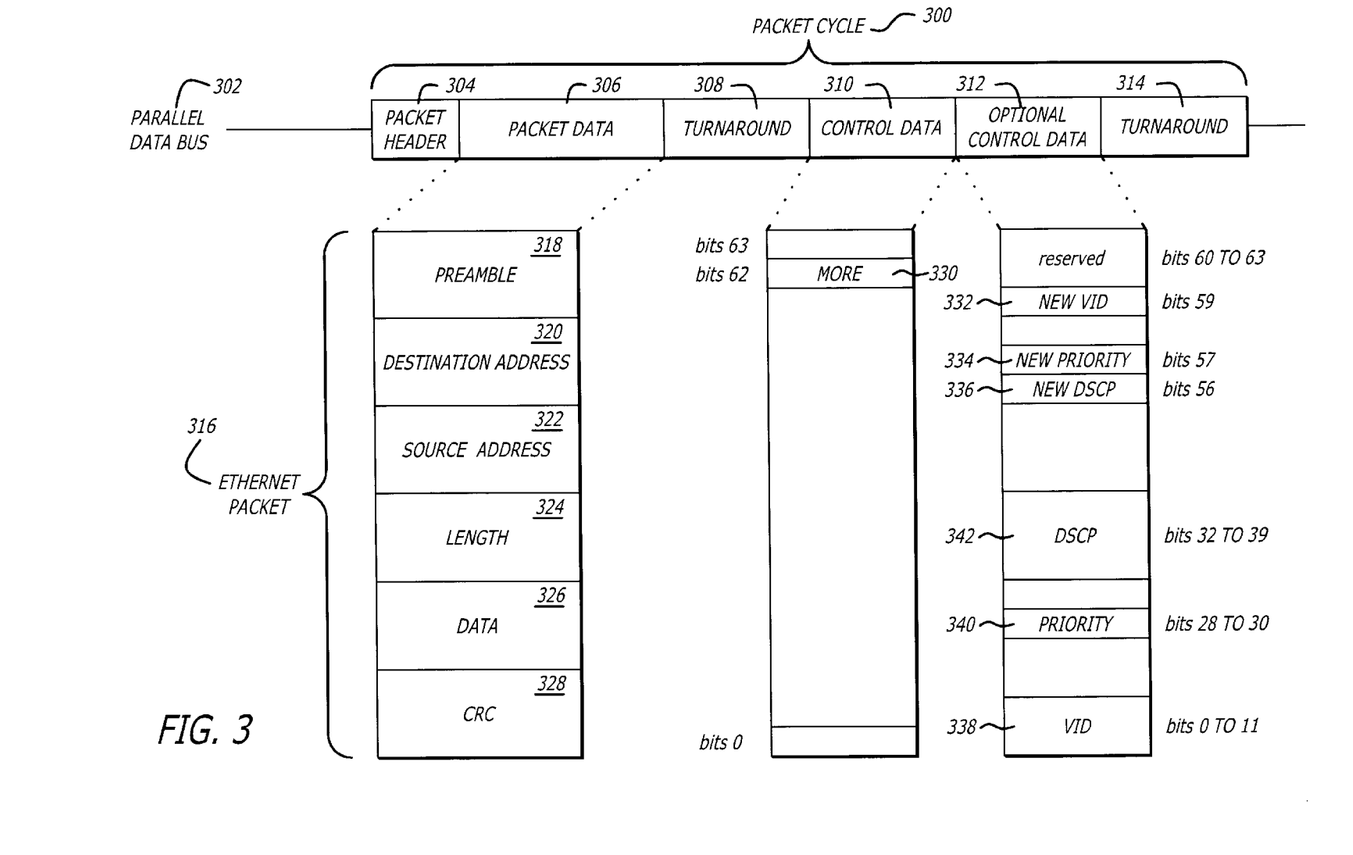
FIG. 3 is an exemplary timing diagram illustrating a packet cycle that is generated and placed on parallel data bus.

FIG. 3 is an exemplary timing diagram illustrating a packet cycle 300 that is generated and placed on parallel data bus 302. It should be noted that parallel data bus 302 is generally equivalent to bus 204 in FIG. 2.

In general, one packet cycle 300 needs to be generated to transmit one data packet. Each packet cycle 300 includes the following operational cycles: packet header cycle 304, packet data cycle 306, turnaround cycle 308, control data cycle 310, optional control data cycle 312, and turnaround cycle 314.

Each packet cycle 300 includes one packet header cycle 304. Packet header cycle 304 occurs on parallel data bus 302 before packet data cycle 306. In each packet header cycle 304, information needed to process a packet is transmitted. For example, information transmitted during a packet header cycle 304 can include a virtual local area network identifier (VID), priority bits as specified by IEEE Standard 802.1p, the source port, the length of packet data, and error bits. In one embodiment where parallel data bus is a 64-bit bus, packet header cycle 304 is used to transmit a 64-bit value, and therefore occupies parallel data bus 302 for one system clock cycle.

Each packet cycle 300 also includes one packet data cycle 306. In one embodiment, one Ethernet packet 316 is transmitted in each packet data cycle 306. An Ethernet packet 316 can be between sixty-four (64) and one thousand five hundred twenty-two (1522) bytes in length. If the length of the Ethernet packet is not evenly divisible by eight, the packet will be appropriately padded prior to being placed on parallel data bus 302. In an embodiment where parallel data bus 302 is 64-bit wide, each packet data cycle 306 can occupy parallel data bus 302 for eight (8) to two hundred twenty three (223) system clock cycles to transmit one Ethernet packet 316.

Ethernet packet 316 includes a preamble 318, a destination address 320, a source address 322, a length value 324, a data portion 326, and a CRC value 328. Destination address 320 occupies six (6) bytes of the packet 316, and identifies a data destination at which the packet 316 is to be received. A destination address 320 of all ones may be used to indicate a broadcast message to be received at all data destinations of the network. The source address 322 also occupies six (6) bytes of the packet 316, and specifies the data source from which the packet originated.

Length value 324 occupies two (2) bytes, and indicates the length of the packet 316, excluding the preamble 318, the CRC 328, and the length value 324 itself. Data portion 326 follows length value 324, and can include upper layer headers and user data. CRC value 328 follows data portion 326, and is four (4) bytes in length. CRC value 328 is generated utilizing all preceding bytes within the packet. Accordingly if any modifications were made to the packet 316, a new CRC value would have to be generated to reflect the modifications.

Each packet cycle 300 on parallel data bus 302 further includes turnaround cycles 308, 314. Each turnaround cycle 308, 314 generally offers the contention-free opportunity for one device attached to parallel data bus 302 to stop driving the data bus 302, and allows another device attached to the data bus 302 to drive the data bus 302.

The first turnaround cycle 308 occurs between packet data cycle 306 and control data cycle 310. During the first turnaround cycle 308, bridging module 206 (shown in FIG. 2) turns off its circuitry that drives parallel data bus 302, while switching module 202 (also shown in FIG. 2) turns on its circuitry that drives parallel data bus 302.

The second turnaround cycle 314 occurs after control data cycle 310, and also after optional data cycle 312, if present. During the second turnaround cycle 314, switching module 202 (shown in FIG. 2) turns off its circuitry that drives parallel data bus 302, while bridging module 206 (also shown in FIG. 2) turns on its circuitry that drives parallel data bus 302.

In one embodiment, each turnaround cycle 308, 314 is used to transmit a 64-bit value. In this embodiment, each turnaround cycle 308, 314 would occupy a parallel data bus 302 that is 64-bit wide for one system clock cycle.

Control data cycle 310 is the first cycle in which control data is placed on parallel data bus 302 for transmission. Control data cycle 310 is general used to transmit packet-forwarding information, e.g., egress ports, flooding, filtering and sniffing bits, or the like.

In one embodiment, control data cycle 310 is used to transmit a 64-bit value. In this embodiment, control data cycle 310 would occupy a parallel data bus 302 that is 64-bit wide for one system clock cycle.

A "MORE" bit is included in control data cycle 310 to indicate whether an optional control data cycle 312 will follow the control data cycle 310. In the embodiment, the "MORE" bit 330 is bit sixty-two (62) of the 64-bit value. In this embodiment, a value of one (1) in the "MORE" bit 330 would specify that there will be an optional control data cycle 312 following the control data cycle 310. On the other hand, a value of zero (0) in the "MORE" bit 330 would specify that there will not be an optional control data cycle 312 following the control data cycle 310.

Optional control data cycle 312 is generally used to transmit packet modification commands and data fields relating to the packet modification commands. In one embodiment, a 64-bit value is transmitted in the optional control data cycle 312. In this embodiment, optional control data cycle 312 would occupy a parallel data bus that is 64-bit wide for one system clock cycle.

Exemplary packet modification commands transmitted during optional control data cycle 312 can include "NEW VID" 332, "NEW PRIORITY" 334, and "NEW DSCP" 336. Exemplary data fields transmitted during optional control data cycle 312 can include "VID" 338, "PRIORITY" 340, and "DSCP" 342.

"NEW VID" command 332 specifies whether the virtual local area network identifier (VID) of the packet transmitted in packet data cycle should be replaced by the new identifier found in the "VID" data field 338.

In one embodiment, "NEW VID" command 332 is included in bit fifty-nine (59) of optional control data cycle 312, and "VID" data field 338 is included in bits zero (0) to eleven (11) of optional control data cycle 312. In this embodiment, a value of one (1) in the "NEW VID" command 332 specifies that the virtual local area network identifier (VID) of the packet transmitted in packet data cycle shall be replaced by the new identifier found in the "VID" data field 338. On the other hand, a value of zero (0) in the "NEW VID" command 332 specifies that the VID of the packet should be retained.

"NEW PRIORITY" command 334 specifies whether the priority bits (as defined by IEEE Standard 802.1p) of the packet transmitted in packet data cycle should be replaced by the value in the "PRIORITY" data field 340.

In one embodiment, "NEW PRIORITY" command 334 is included in bit fifty-seven (57) of optional control data cycle 312, and "PRIORITY" data field 340 is included in bits twenty-eight (28) to thirty (30) of optional control data cycle 312. In this embodiment, a value of one (1) in the "NEW PRIORITY" command 334 specifies that the priority bits of the packet transmitted in packet data cycle shall be replaced by the priority bits found in the "PRIORITY" data field 340. On the other hand, a value of zero (0) in the "NEW PRIORITY" command 334 specifies that the priority bits of the packet should be retained.

"NEW DSCP" command 336 specifies that the diffserv code point (DSCP) of the packet transmitted in packet data cycle should be replaced by the value in the "DSCP" data field 342.

In one embodiment, "NEW DSCP" command 336 is included in bit fifty-six (56) of optional control data cycle 312, and "DSCP" data field 342 is included in bits thirty-two (32) to thirty-nine (39) of optional control data cycle 312. In this embodiment, a value of one (1) in the "NEW DSCP" command 336 specifies that the priority bits of the packet transmitted in packet data cycle shall be replaced by the priority bits found in the "DSCP" data field 342. On the other hand, a value of zero (0) in the "NEW DSCP" command 336 specifies that the priority bits of the packet should be retained.

As stated above when bridging module 206 (shown in FIG. 2) modifies content of a data packet, the module 206 needs to compute a new CRC value to reflect the changes made in the packet. In computing the new CRC value, bridging module 206 uses a CRC polynomial as the initial building block. In one embodiment, bridging module utilizes a standard IEEE Ethernet CRC polynomial.

Figure 4:
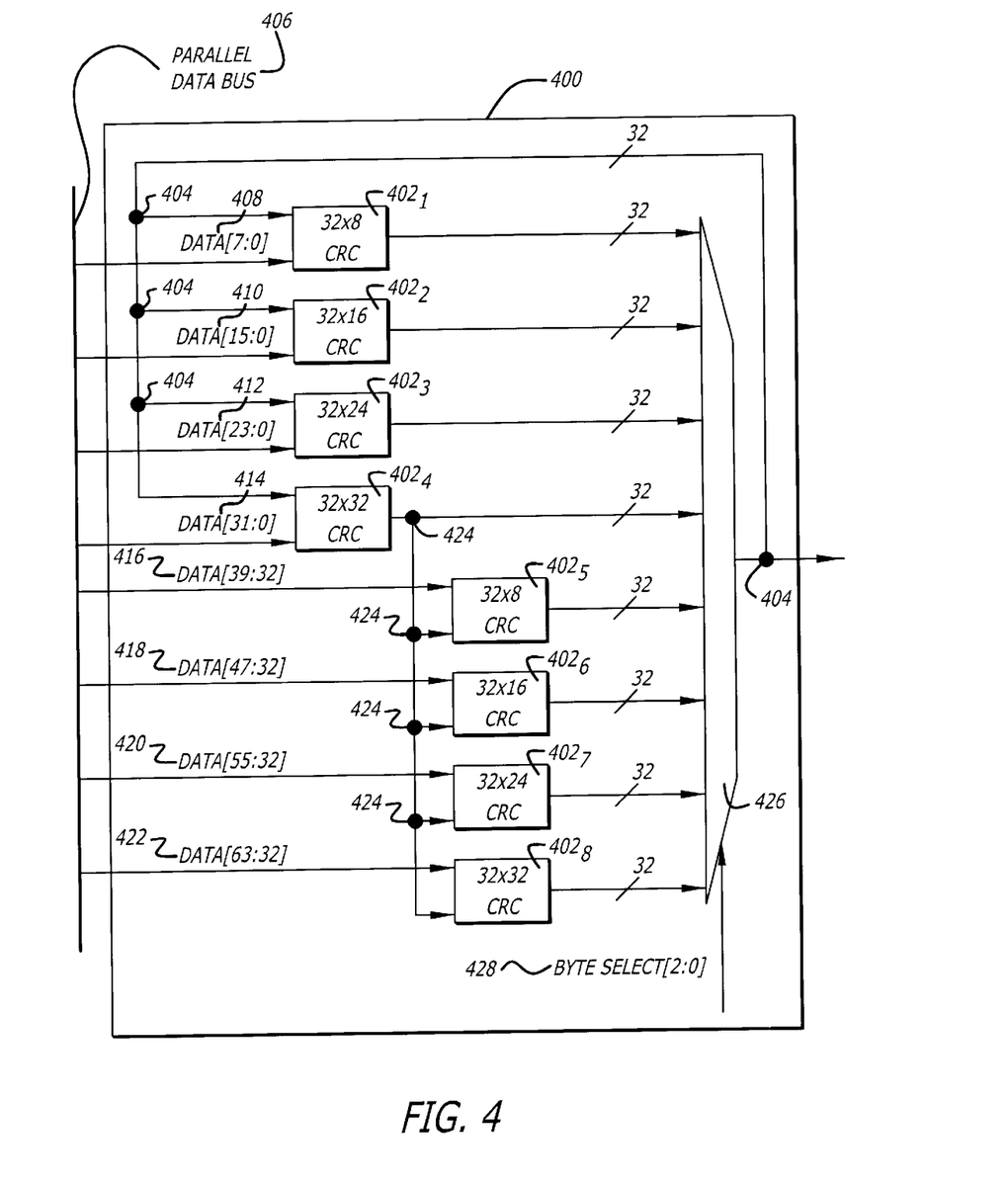
FIG. 4 is an exemplary block diagram of a bridging module.

FIG. 4 is an exemplary block diagram of a bridging module 400. It should be noted bridging module 400 is generally equivalent to module 206 in FIG. 2.

Bridging module 400 includes a number of CRC generators $402_1$, $402_2$, ..., $402_8$ operating in parallel to produce a 4-byte or 32-bit CRC value 404. These parallel CRC generators $402_1$, $402_2$, ..., $402_8$ are operatively coupled to parallel data bus and generally calculate the CRC value 404 based on a different bit segment of the data bus.

Parallel data bus 406 is shown as having sixty-four (64) bits in width. It should be noted that parallel data 406 bus is merely one of many possible implementations of data bus 204 in FIG. 2 and data bus 302 in FIG. 3. As such, bus 204 in FIG. 2 and bus 302 in FIG. 3 could be implemented as data buses that are less than 64-bit wide or more than 64-bit wide.

Prior to describing components in FIG. 4, an explanation of the iterative process to transmit data packets of varied length using a data bus of limited width is provided. An example of a data packet having varied length is an Ethernet packet. An example of a data bus of limited width is the 64-bit parallel data bus 406 shown in FIG. 4.

As stated above, an Ethernet packet can be between sixty-four (64) and one thousand five hundred twenty-two (1522) bytes in length. Furthermore, each Ethernet packet includes a 4-byte CRC value that is calculated using bytes preceding the CRC value in the packet. As a specific example, an Ethernet packet that is sixty-four (64) bytes in length would have sixty (60) bytes of data and a 4-byte CRC value computed based on the sixty (60) bytes of data.

If a 64-bit data bus (e.g., parallel data bus 406 in FIG. 4) were used to transmit the 64-byte Ethernet packet, eight (8) transmission cycles would be required to transmit the packet. During each transmission cycle, sixty-four (64) bits or eight (8) bytes of the Ethernet packet can be transmitted using the 64-bit data bus. In each of the first to seventh transmission cycles, eight (8) bytes of data are transmitted. In the last transmission cycle, four (4) bytes of data are transmitted along with the 4-byte CRC value. As stated above in the text describing FIG. 3, the CRC value in an Ethernet packet is generated utilizing all bytes preceding the CRC value in the packet.

Returning to FIG. 4, bridging module 400 uses a CRC polynomial as the initial building block. In one embodiment, a standard 32-bit IEEE CRC polynomial is utilized. As bridging module 400 receives incoming data bytes from a current transmission cycle on parallel data bus 406, CRC generators $402_1$, $402_2$, ..., $402_8$ operating in parallel to examine the incoming data bytes and compute an updated CRC value 404 based on the incoming data bytes. In each of the first through the next-to-the-last transmission cycles, the CRC value 404 is fed or looped back into CRC generators $402_1$, $402_2$, $402_3$, $402_4$ so that these CRC generators can update the value 404 based on incoming data bytes from the next transmission cycle. In the last transmission cycle, the last data bytes of the packet transmitted during the cycle is considered and the CRC value 404 is updated accordingly. After the last transmission cycle, the value 404 is the CRC for the entire packet.

The first set of CRC generators includes "32×8 CRC" $402_1$, "32×16 CRC" $402_2$, "32×24 CRC" $402_3$, and "32×32 CRC" $402_4$. Each of the CRC generators $402_1$, $402_2$, $402_3$, $402_4$ receives as input a CRC value computed based on data transmitted during the previous transmission cycle and data extracted from certain bit segments of parallel data bus during the current transmission cycle.

"32×8 CRC" generator $402_1$ is operatively coupled to parallel data bus 406 to update the CRC value 404 based on data 408 extracted from bits zero (0) to seven (7) of parallel data bus during the current transmission cycle. "32×16 CRC" generator $402_2$ is operatively coupled to parallel data bus 406 to update the input CRC value 404 based on data 410 extracted from bits zero (0) to fifteen (15) of parallel data bus 406 during the current transmission cycle.

"32×24 CRC" generator $402_3$ is operatively coupled to parallel data bus 406 to update the input CRC value 404 based on data 410 extracted from bits zero (0) to twenty-three (23) of parallel data bus 406 during the current transmission cycle. "32×32 CRC" generator $402_4$ is operatively coupled to parallel data bus 406 to update the input CRC value 404 based on data 412 extracted from bits zero (0) to thirty-one (31) of parallel data bus 406 during the current transmission cycle.

The second set of parallel CRC generators includes "32×8 CRC" $402_5$, "32×16 CRC" $402_6$, "32×24 CRC" $402_7$, and "32×32 CRC" $402_8$. Each of these generators receives as input a CRC value generated by "32×32 CRC" generator 4024 and data extracted from the first half of parallel data bus 406 during the current transmission cycle.

"32×8 CRC" generator $402_5$ is operatively coupled to parallel data bus to update the input CRC value 424 based on data 416 extracted from bits thirty-two (32) to thirty-nine (39) of parallel data bus 406 during the current transmission cycle. The CRC value 424 is computed by "32×32 CRC" generator $402_4$ in consideration of data extracted from bits zero (0) to thirty-one (31) of parallel data bus during the current transmission cycle. Accordingly, the output of "32×8 CRC" generator $402_5$ is effectively a CRC value computed in consideration of data extracted from bits zero (0) to thirty-nine (39) of parallel data bus during the current transmission cycle.

"32×16 CRC" generator $402_6$ is operatively coupled to parallel data bus 406 to update the input CRC value 424 based on data 418 extracted from bits thirty-two (32) to forty-seven (47) of parallel data bus 406 during the current transmission cycle. As stated above, the CRC value 424 is computed by "32×32 CRC" generator $402_4$ in consideration of data extracted from bits zero (0) to thirty-one (31) of parallel data bus 406 during the current transmission cycle. Therefore, the output of "32×16 CRC" generator $402_6$ is effectively a CRC value computed in consideration of data extracted from bits zero (0) to forty-seven (47) of parallel data bus 406 during the current transmission cycle.

"32×24 CRC" generator $402_7$ is operatively coupled to parallel data bus 406 to update the input CRC value 424 based on data 420 extracted from bits thirty-two (32) to fifty-five (55) of parallel data bus 406 during the current transmission cycle. As stated above, the CRC value 424 is computed by "32×32 CRC" generator $402_4$ in consideration of data extracted from bits zero (0) to thirty-one (31) of parallel data bus 406 during the current transmission cycle. Accordingly, the output of "32×24 CRC" generator $402_7$ is effectively a CRC value computed in consideration of data extracted from bits zero (0) to forty-seven (47) of parallel data bus during the current transmission cycle.

"32×32 CRC" generator $402_8$ is operatively coupled to parallel data bus 406 to update the input CRC value 424 based on data 422 extracted from bits thirty-two (32) to sixty-three (63) of parallel data bus 406 during the current transmission cycle. As stated above, the CRC value 424 is computed by "32×32 CRC" generator $402_4$ in consideration of data extracted from bits zero (0) to thirty-one (31) of parallel data bus 406 during the current transmission cycle. Accordingly, the output of "32×32 CRC" generator $402_8$ is effectively a CRC value computed in consideration of data extracted from bits thirty-two (32) to sixty-three (63) of parallel data bus 406 during the current transmission cycle.

The CRC values generated by CRC generators $402_1$, $402_2$, ..., $402_8$ are fed into selector 426. Selector 426 generally chooses one of the CRC values, as specified by ByteSelect value. In other words, ByteSelect value effectively specifies the bit segment on parallel data bus from which data should be extracted and considered in generating a CRC value.

In one embodiment, ByteSelect value 428 is a 3-bit value and is used to instruct choose one of the CRC values generated by CRC generators $402_1$, $402_2$, ..., $402_8$. Table 1 included below provides a more detail description.

TABLE 1

| Binary Value of 3-bit ByteSelect | Action of Selector | Explanation |
| --- | --- | --- |
| 001 | Selector 426 chooses CRC value generated by "32 × 8 CRC" $402_1$ | One (1) byte of data extracted from bits zero (0) to seven (7) of parallel data bus should be considered in updating the CRC value 404. |
| 010 | Selector 426 chooses CRC value generated by "32 × 16 CRC" $402_2$ | Two (2) bytes of data extracted from bits zero (0) to fifteen (15) of parallel data bus should be considered in updating the CRC value 404. |
| 011 | Selector 426 chooses CRC value generated by "32 × 24 CRC" $402_3$ | Three (3) bytes of data extracted from bits zero (0) to twenty-three (23) of parallel data bus should be considered in updating the CRC value 404. |
| 100 | Selector chooses CRC value generated by "32 × 32 CRC" $402_4$ | Four (4) bytes of data extracted from bits zero (0) to thirty-one (31) of parallel data bus should be considered in updating the CRC value 404. |
| 101 | Selector chooses CRC value generated by "32 × 8 CRC" $402_5$ | Five (5) bytes of data extracted from bits zero (0) to thirty-nine (39) of parallel data bus should be considered in updating the CRC value 424. |
| 110 | Selector chooses CRC value generated by "32 × 16 CRC" $402_6$ | Six bytes (6) of data extracted from bits zero (0) to forty-seven (47) of parallel data bus should be considered in updating the CRC value 424. |
| 111 | Selector chooses CRC value generated by "32 × 24 CRC" $402_7$ | Seven (7) bytes of data extracted from bits zero (0) to fifty-five (55) of parallel data bus should be considered in updating the CRC value 424. |

TABLE 1-continued

| Binary Value of 3-bit ByteSelect | Action of Selector | Explanation |
| --- | --- | --- |
| 000 | Selector chooses CRC value generated by "32 × 32 CRC" $402_8$ | All eight (8) bytes of data extracted from bits zero (0) to sixty-three (47) of parallel data bus should be considered in updating the CRC value 424. |

Going back to the above example of using a 64-bit data bus to transmit a 64-byte Ethernet packet. As previously stated, the 64-byte Ethernet packet includes sixty (60) bytes of data and a 4-byte CRC value. Eight (8) transmission cycles will be required to transmit the 64-byte Ethernet packet. In each of the first to the seventh the 60 bytes of data will be transmitted. In the eighth or last transmission cycle, the last four (4) bytes of the 60 bytes of data will be transmitted along with the 4-byte CRC value.

During the first transmission cycle, CRC generators $402_1$, $402_2$, ..., $402_8$ use a CRC polynomial as the initial building block to generate a 32-bit or 4-byte CRC value in consideration of the eight bytes of data transmitted during the cycle.

In each of the second through the seventh transmission cycles, CRC generators $402_1$, $402_2$, ..., $402_8$ continually update the 4-byte CRC value in consideration of the eight (8) data bytes transmitted during each of the cycles. It should be noted that in each of the second through the seventh transmission cycles, ByteSelect 428 will specify that all eight data bytes transmitted in each cycle should be considered by CRC generators $402_1$, $402_2$, ..., $402_8$ in updating the 4-byte CRC value. In one embodiment, ByteSelect 428 is a 3-bit value and is set to binary value of "000" during the first through seventh transmission cycles. See Table 1 for more details.

In the eighth or last transmission cycle, CRC generators $402_1$, $402_2$, ..., $402_8$ updates the 4-byte CRC value in consideration of the last four (4) bytes of the 60 bytes data. In this last cycle, ByteSelect 428 specifies that only the four (4) data bytes transmitted in each cycle should be considered by CRC generators $402_1$, $402_2$, ..., $402_8$ in updating the 4-byte CRC. In one embodiment, ByteSelect 428 is a 3-bit value and is set to binary value of "100" during the eighth transmission cycle. See Table 1 for more details. After the eighth transmission cycle, a 4-byte CRC value for the 64-byte Ethernet packet is generated.

In summary, CRC generators $402_1$, $402_2$, ..., $402_8$ operate in parallel to take serialized bytes of data from parallel data bus 406 during each transmission cycle and calculate a CRC value in consideration of the bytes of data. The number of bytes to be considered could vary in each transmission cycle. CRC generators operate in parallel to consider data extracted from different bit segments of the parallel data bus in producing a set of potential CRC values. Each of the potential CRC values corresponds to one variance of the number of bytes of data that should be considered. A selector is then used to select one of the CRC values as the resulting CRC value.

As stated above, data bus 406 in FIG. 4 is shown as having sixty-four (64) bits in width. It should be noted that parallel data 406 bus is merely one of many possible implementations of data bus 204 in FIG. 2 and data bus 302 in FIG. 3. As such, bus 204 in FIG. 2 and bus 302 in FIG. 3 could be implemented as data buses that are less than 64-bit wide or more than 64-bit wide.

It should be further noted that eight CRC generators $402_1$, $402_2$, ..., $402_8$ are shown in FIG. 4. In practice, the number of CRC generators can be more than eight (8) or less than eight (8) as long as the CRC computation is fast enough to keep up with parallel data bus 406. In addition, if parallel data bus 406 had a width that is less than 64-bit, the number of required CRC generators could be less than eight. If parallel data bus 406 had a width that is more than 64-bit, the number of required CRC generators could be more than eight. Furthermore, CRC generators $402_1$, $402_2$, ..., $402_8$ are shown to be working in conjunction and in parallel to generate a 32-bit or 4-byte CRC value. However, a CRC value can be more than thirty-two (32) bits or four (4) bytes in length. If a CRC value having a length of more than four (4) bytes is employed, the number of required CRC generators may be more than eight (8). On the other hand, if a CRC value having a length of less than four (4) bytes is employed, the number of required CRC generators may be less than eight (8).

Figure 5:
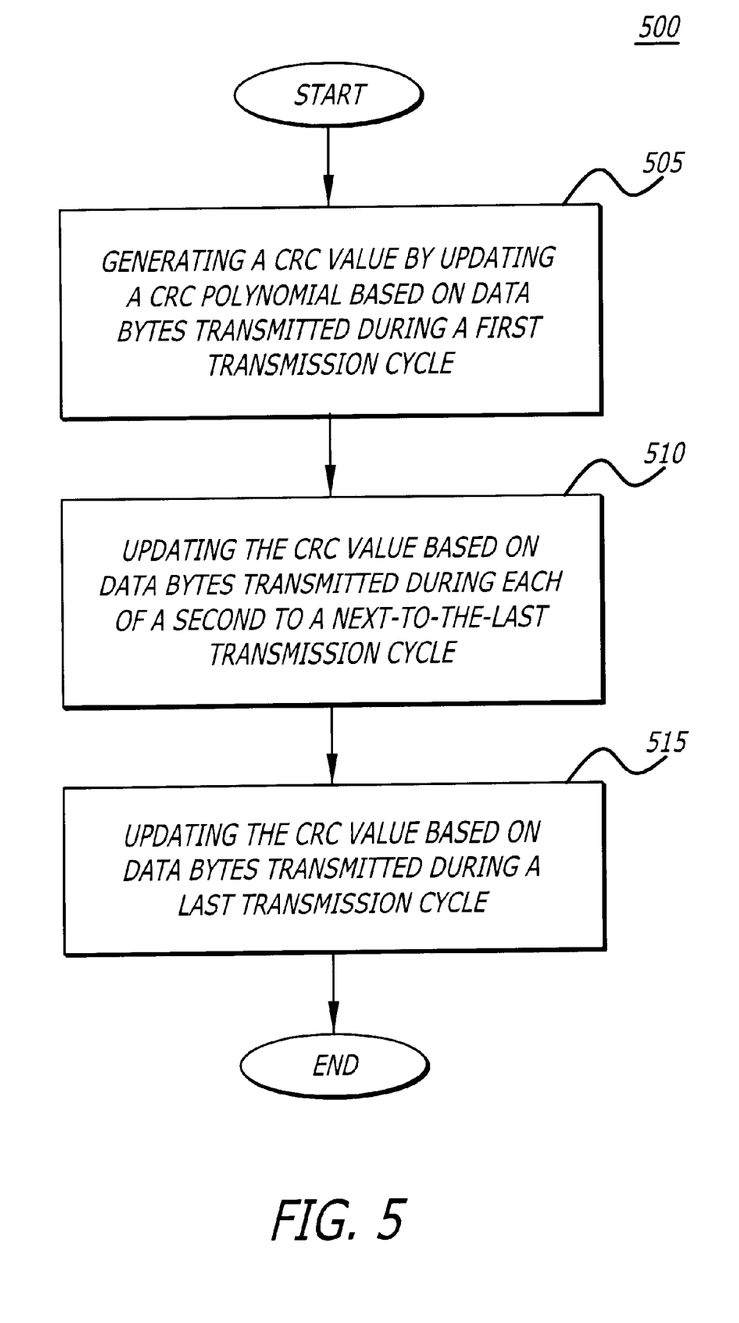
FIG. 5 is an exemplary flow chart generally outlining a process 500 of computing a Cyclic Redundancy Check (CRC) value.

FIG. 5 is an exemplary flow chart generally outlining a process 500 of computing a CRC value. In block 500, a CRC value is generated by updating a CRC polynomial based on data bytes transmitted during the first transmission cycle. In one embodiment, the CRC polynomial is a 32-bit IEEE Ethernet CRC polynomial.

As stated in the above example of using a 64-bit data bus to transmit a 64-byte Ethernet packet, the 64-byte Ethernet packet includes sixty (60) bytes of data and a 4-byte CRC value generated based on the original packet. Eight (8) transmission cycles will be required to transmit the 64-byte Ethernet packet. In each of the first to the seventh cycles, eight (8) of the sixty (60) bytes of data in the packet will be transmitted.

During the first transmission cycle, CRC generators $402_1$, $402_2$, ..., $402_8$ (shown in FIG. 4) a CRC polynomial as the initial building block in generating a CRC value for the current packet. These CRC generators $402_1$, $402_2$, ..., $402_8$ operate in parallel to update the polynomial based on the eight bytes of data transmitted during the cycle. After the first transmission cycle, a 32-bit or 4-byte CRC value would be initially generated.

In block 510, the CRC value is continually updated based on data bytes transmitted during of each of the second to the next-to-the-last transmission cycles. Continuing with the example of using a 64-bit data bus to transmit a 64-byte Ethernet packet, CRC generators $402_1$, $402_2$, ..., $402_8$ (shown in FIG. 4) continually update the 4-byte CRC value based on data bytes transmitted during each of the second through the seventh transmission cycles.

It should be noted that in each of the second through the seventh transmission cycles, ByteSelect 428 (shown in FIG. 4) will specify that all data bytes transmitted in each cycle should be considered by CRC generators $402_1$, $402_2$, ..., $402_8$ in updating the 4-byte CRC value.

In box 515 of FIG. 5, the CRC value is updated based on only data bytes transmitted during the last or eighth transmission cycle. Going on with the example of using a 64-bit data bus to transmit a 64-byte Ethernet packet, the last four (4) bytes of the 60 bytes of data in the packet will be transmitted along with the 4-byte CRC value in the last transmission cycle. ByteSelect 428 (shown in FIG. 4) will specify that only the four (4) data bytes transmitted in each cycle should be considered by CRC generators 402$_1$, 402$_2$, ..., 402$_8$ (also shown in FIG. 4) in updating the 4-byte CRC value. Accordingly, CRC generators 402$_1$, 402$_2$, ..., 402$_8$ updates the 4-byte CRC value in based on these last four (4) data bytes, while ignoring the non-data bytes (i.e., the 4-byte CRC value generated based on the original packet) that are transmitted along with the four bytes of data in the last transmission cycle.

While certain exemplary embodiments have been described and shown in accompanying drawings, it is to be understood that such embodiments are merely illustrative of and not restrictive on the broad invention, and that this invention not be limited to the specific constructions and arrangements shown and described, since various other modifications may occur to those ordinarily skilled in the art.

In addition, it is possible to implement the present invention or some of its features in hardware, firmware, software or a combination thereof where the software is provided in a machine readable storage medium such as a magnetic, optical, or a semiconductor storage medium. If the present invention or one or more of its features is implemented in firmware or software code segments, each of the code segments would include one or more programming instructions.

What is claimed is:

1. A network switch, comprising:
   a switching module operatively coupled to a parallel data bus, the switching module generates and places a packet cycle on the parallel data bus, the packet cycle being used to transmit a data packet and packet modification commands to modify the data packet; and
   a bridging module operatively coupled to the parallel data bus, the bridging module modifies the data packet in accordance to the packet modification commands, and generates a Cyclic Redundancy Check (CRC) value to reflect modifications made to the data packet.

2. The switch of claim 1, wherein the packet cycle includes an optional control data cycle, the optional control data cycle includes the packet modification commands and data fields related to the packet modification commands.

3. The switch of claim 1, wherein the CRC value is four bytes in length.

4. The switch of claim 1, wherein the bridging module includes a plurality of CRC generators operating in parallel to generate the CRC value.

5. The switch of claim 4, wherein the parallel data bus is a 64-bit bus, and the plurality of CRC generators includes a CRC generator that updates the CRC value based on data extracted from bits zero to seven of the parallel data bus.

6. The switch of claim 4, wherein the parallel data bus is a 64-bit bus, and the plurality of CRC generators includes a CRC generator that updates the CRC value based on data extracted from bits zero to fifteen of the parallel data bus.

7. The switch of claim 4, wherein the parallel data bus is a 64-bit bus, and the plurality of CRC generators includes a CRC generator that updates the CRC value based on data extracted from bits zero to twenty-three of the parallel data bus.

8. The switch of claim 4, wherein the parallel data bus is a 64-bit bus, and the plurality of CRC generators includes a CRC generator that updates the CRC value based on data extracted from bits zero to thirty-one of the parallel data bus.

9. The switch of claim 4, wherein the parallel data bus is a 64-bit bus, and the plurality of CRC generators includes a CRC generator that updates the CRC value based on data extracted from bits zero to thirty-nine of the parallel data bus.

10. The switch of claim 4, wherein the parallel data bus is a 64-bit bus, and the plurality of CRC generators includes a CRC generator that updates the CRC value based on data extracted from bits zero to forty-seven of the parallel data bus.

11. The switch of claim 4, wherein the parallel data bus is a 64-bit bus, and the plurality of CRC generators includes a CRC generator that updates the CRC value based on data extracted from bits zero to fifty-five of the parallel data bus.

12. The switch of claim 4, wherein the parallel data bus is a 64-bit bus, and the plurality of CRC generators includes a CRC generator that updates the CRC value based on data extracted from bits zero to sixty-three of the parallel data bus.

13. The switch of claim 4, wherein the bridging module includes a selector to choose one of a plurality of CRC values generated by the plurality of CRC generators.

14. The switch of claim 13, wherein the bridging module includes byte select value to specify which of the plurality of CRC values generated the plurality of CRC generators should be chosen.

15. The switch of claim 13, wherein the byte select value is a 3-bit value.

16. A method comprising:
   generating a CRC value by updating a CRC polynomial based on data bytes transmitting during a first transmission cycle by utilizing a plurality CRC generators operating in parallel to generate the CRC value by updating the CRC polynomial;
   updating the CRC value based on data bytes transmitted during each of a second to a next-to-the-last transmission cycles; and
   updating the CRC value based on data bytes transmitted during a last transmission cycle.

17. A method comprising:
   generating a Cyclic Redundancy Check (CRC) value by updating a CRC polynomial based on data bytes transmitting during a first transmission cycle;
   updating the CRC value based on data bytes transmitted during each of a second to a next-to-the-last transmission cycles by a plurality of CRC generators operating in parallel; and
   updating the CRC value based on data bytes transmitted during a last transmission cycle.

18. A method comprising:
   generating a Cyclic Redundancy Check (CRC) value by updating a CRC polynomial based on data bytes transmitting during a first transmission cycle;
   updating the CRC value based on data bytes transmitted during each of a second to a next-to-the-last transmission cycles; and
   updating the CRC value based on data bytes transmitted during a last transmission cycle by a plurality of CRC generators operating in parallel.

19. The method of claim 18, further includes using each of the plurality of CRC generators to update the CRC value based on data extracted from a bit segment of a parallel data bus.

20. The method of claim 19, further includes:
   feeding outputs of the plurality of CRC generators into a selector; and using a byte select value to instruct selector to choose one of the outputs of the plurality of CRC generators that are fed into the selector.

21. A network switch, comprising:

a switching module operatively coupled to a data bus, the switching module generates and places a packet cycle on the data bus, the packet cycle being used to transmit a data packet and packet modification commands to modify the data packet; and a bridging module operatively coupled to the data bus, the bridging module modifies the data packet in accordance to the packet modification commands, and generates a Cyclic Redundancy Check (CRC) value to reflect modifications made to the data packet.

22. The network switch of claim 21, wherein the bridging module includes:

a plurality of CRC generators operating in parallel to generate a plurality of potential CRC values; and each of the plurality of CRC generators produces one of the plurality of potential CRC values based on data extracted from a bit segment of the data bus.

23. The network switch of claim 22, wherein the bridging module includes a selector to choose the CRC value from the plurality of potential CRC values based on a select value.

24. A computer program embodied on a computer-readable medium, comprising:

a first code segment to generate and place a packet cycle on a parallel data bus, the packet cycle being used to transmit a data packet and packet modification commands to modify the data packet; and second code segment to modify the data packet in accordance to the packet modification commands, and generates a Cyclic Redundancy Check (CRC) value to reflect modifications made to the data packet.

* * * * *